(12) United States Patent
Zaliznyak et al.

(10) Patent No.: US 8,835,769 B1
(45) Date of Patent: Sep. 16, 2014

(54) HIGH SPEED SERIAL INTERFACE

(75) Inventors: Arch Zaliznyak, San Jose, CA (US); Surinder Singh, San Jose, CA (US)

(73) Assignee: Altera Corporation, San Jose, CA (US)

( * ) Notice: Subject to any disclaimer, the term of this patent is extended or adjusted under 35 U.S.C. 154(b) by 51 days.

(21) Appl. No.: 13/524,687

(22) Filed: Jun. 15, 2012

(51) Int. Cl.
*H05K 1/03* (2006.01)
*H01R 12/55* (2011.01)

(52) U.S. Cl.
CPC ..................... *H01R 12/55* (2013.01)
USPC .......................................... 174/255; 174/260

(58) Field of Classification Search
CPC ........... H01R 12/585; H01R 13/65807; H01R 23/688
See application file for complete search history.

(56) References Cited

U.S. PATENT DOCUMENTS

| | | | |
|---|---|---|---|
| 2004/0216071 A1* | 10/2004 | Miller | 716/12 |
| 2006/0228912 A1* | 10/2006 | Morlion et al. | 439/65 |
| 2011/0192640 A1* | 8/2011 | Liu | 174/261 |

* cited by examiner

*Primary Examiner* — Ishwarbhai B Patel
(74) *Attorney, Agent, or Firm* — Ward & Zinna, LLC

(57) ABSTRACT

A high speed serial interface comprises a rectilinear array of rows and columns of contact sites on a substrate. In the first four columns, pairs of transmitter and receiver contacts alternate row-by-row with pairs of ground contacts In the fifth column, there is a permanent (or hard) ground contact adjacent to each transmitter or receiver contact pair located in a row in the third and fourth columns and the remaining contacts in the fifth column are general purpose input/output (GPIO) contacts. As a result, up to 50 percent of the contacts in the fifth column may be GPIO contacts. In the sixth column, all the contacts are GPIO contacts.

18 Claims, 2 Drawing Sheets

HIGH SPEED SERIAL INTERFACE

BACKGROUND

This relates to package design and more particularly to patterns of electrical interconnects that are used for high performance devices such as high speed differential signaling transceiver pairs and memory interfaces. As is known in the art, such interfaces are typically implemented using a ball grid array (BGA) or a pin grid array (PGA) A BGA is an area array of solder balls or solder bumps that is located on the surface of a package. A PGA is an area array of pins underneath a package surface. The BGA or PGA is used to connect the package to the next level of package. See, R. R. Tummala, *Fundamentals of Microsystems Packaging*, pp. 67, 68, 279-281, 680-682, 925 (McGraw-Hill, 2001), which is incorporated by reference herein in its entirety. For convenience, the term "contacts" or "interconnects" will be used hereafter to refer to solder balls, solder bumps and interconnect pins as well as similar connectors In designing high speed differential signaling interfaces, it is important to achieve nominal differential impedance and good isolation between the high speed differential signaling interconnects. The practice has been to use as many ground contacts as possible to surround each pair of high speed differential signaling contacts. This, however, results in the use of large numbers of ground contacts, leading to consequences such as the need for trade-offs between the number of ground contacts and the number of I/O contacts, trade-offs in the number of ground contacts versus performance, and/or increases in the size of the interconnect package.

In designing high speed differential signaling interfaces, one approach has been to locate the differential signaling pairs in the vicinity of ground contacts. FIG. 1 depicts one such arrangement comprising a rectilinear array 100 of rows 102 and columns 104 of contact sites 110 on a substrate 120. As shown in FIG. 1, columns 104 are parallel to an edge 122 of substrate 220. In the first four columns, pairs of transmitter and receiver contacts 130, 140 alternate row-by-row with pairs of ground contacts 150. The pairing of two transmitter contacts 130 or two receiver contacts 140 is symbolized by a solid line between the pair. In the fifth and sixth columns, the contacts are general purpose input/output (GPIO) contacts 160. In this arrangement, the ground contacts 150 are permanently connected to ground, which is sometimes referred to as "hard-grounded." The GPIO contacts may be switched so that they are connected to ground in some applications such as when an adjacent signaling pair is being used for differential signal transmission or reception but are otherwise available for use as general purpose input/output contacts. A switchable ground connection is sometimes referred to a "soft-grounded." This arrangement has the advantage that two full columns of GPIO contacts are available for use as general purpose contacts. However, it has the disadvantage that the GPIO contacts do not provide adequate shielding for the high speed serial interface of the differential signal contacts 130, 140 with the result that cross-talk jitter is too high.

FIG. 2 depicts an alternative arrangement comprising a rectilinear array 200 of rows 202 and columns 204 of contact sites 210 on a substrate 220. Again, columns 204 are parallel to an edge 222 of substrate 220. In the first four columns, pairs of transmitter and receiver contacts 230, 240 alternate row-by-row with pairs of ground contacts 250. Again, the pairing of two transmitter contacts 230 or two receiver contacts 240 is symbolized by a solid line between the pair. In the fifth column, the contacts are all ground contacts 250 that are permanently connected to ground (i.e., are hard-grounded); and in the sixth column, the contacts are all GPIO contacts 260. In this arrangement, the ground contacts of the fifth column provide adequate shielding for the high speed serial interface of the transmitter and receiver contacts 230, 240 but at the price of making the contacts of the fifth column unavailable for use for general purpose input/output.

SUMMARY

The present invention is an improved. interface with reduced cross-talk and more efficient use of available contacts.

In a preferred embodiment of the invention, the interface comprises a rectilinear array of rows and columns of contact sites on a substrate. In the first four columns, pairs of transmitter and receiver contacts alternate row-by-row with pairs of ground contacts In the fifth column, there is a permanent (or hard) ground contact adjacent to each transmitter or receiver contact pair located in a row in the third and fourth columns and the remaining contacts in the fifth column are general purpose input/output (GPIO) contacts. As a result, up to 50 percent of the contacts in the fifth column may be GPIO contacts. In the sixth column, all the contacts are GPIO contacts.

Numerous variations may be practiced in the preferred embodiment.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1:
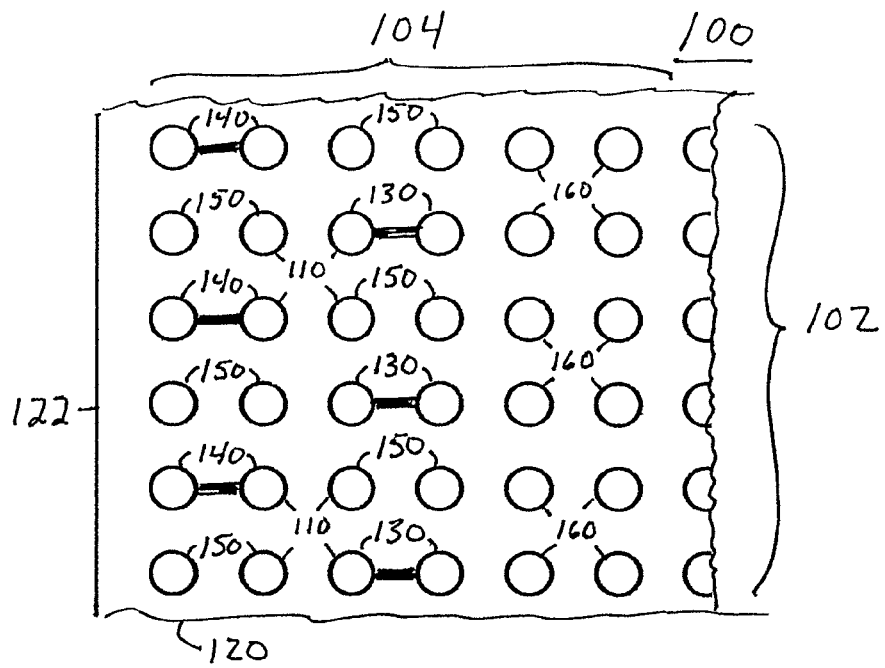
FIG. 1 depicts a first prior art interface.
Figure 2:
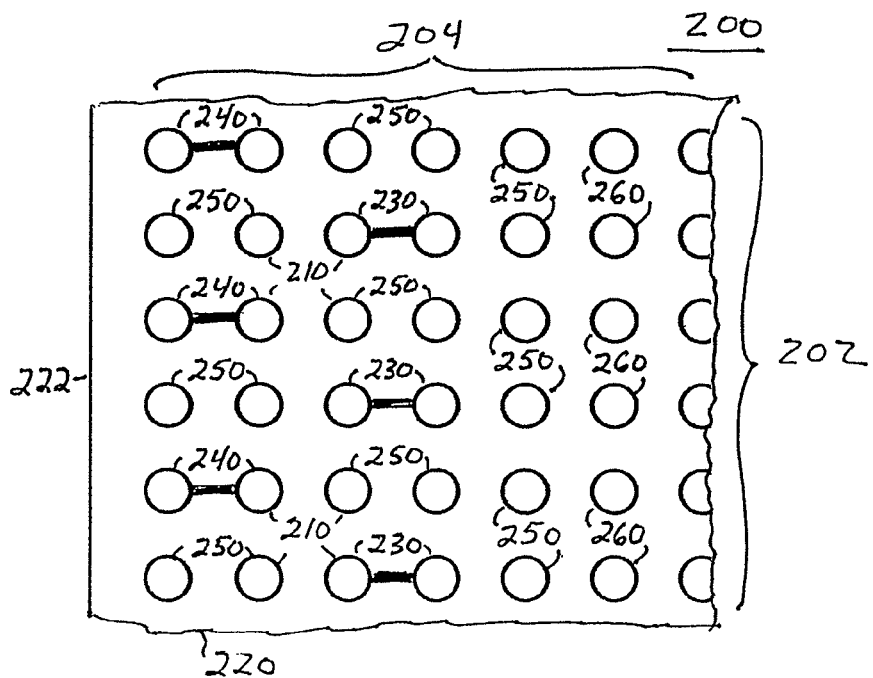
FIG. 2 depicts a second prior art interface.
Figure 3:
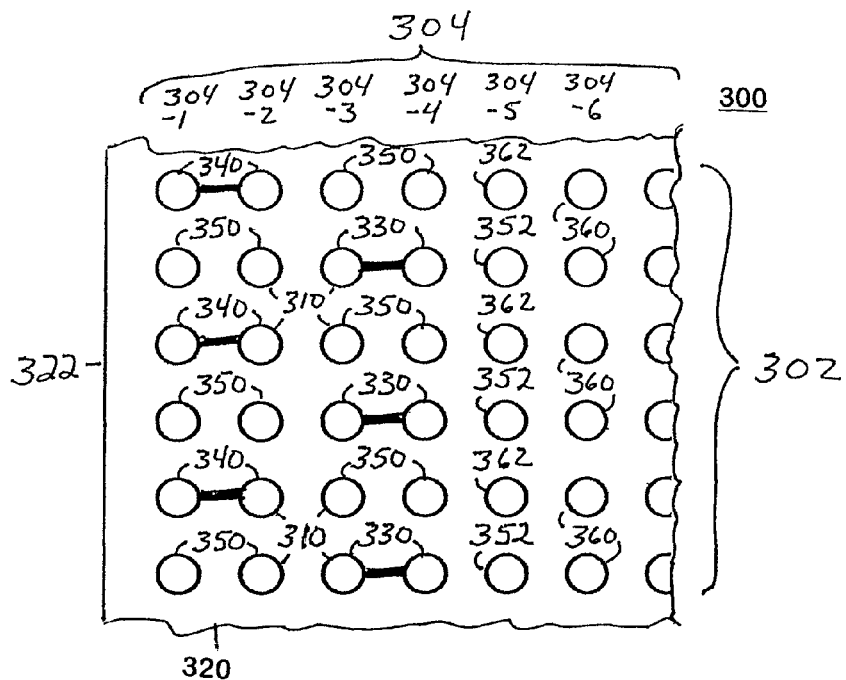
FIG. 3 depicts an illustrative embodiment of an interface of the present invention.

FIG. 3 depicts an illustrative embodiment of the invention formed in a rectilinear array 300 of rows 302 and columns 304 of contact sites 310 on a substrate 320. In the first four columns 304-1, 304-2, 304-3 and 304-4, pairs of transmitter and receiver contacts 330, 340 alternate row-by-row with pairs of ground contacts 350. Again, the pairing of two transmitter contacts 330 or two receiver contacts 340 is symbolized by a solid line between the pair. In the fifth column 304-5, there is a permanent (or hard) ground contact 352 in each row that is adjacent to each transmitter or receiver contact pair 330, 340 that is located in a row in the third and fourth columns 304-3, 304-4 and the remaining contacts 362 in the fifth column are general purpose input/output (GPIO) contacts 360. As a result, as many as half the contacts in the fifth column are GPIO contacts. In the sixth column 304-6, all the contacts are GPIO contacts 360.

In the embodiment of FIG. 3, columns 304 are parallel to an edge 322 of substrate 320 with column 304-1 being closest to the edge and with no contact sites being located between column 304-1 and edge 322. The remaining columns in FIG. 3 are numbered in order with increasing distance from edge 322. In other circumstances, other numbering arrangements may be used.

Figure 4:
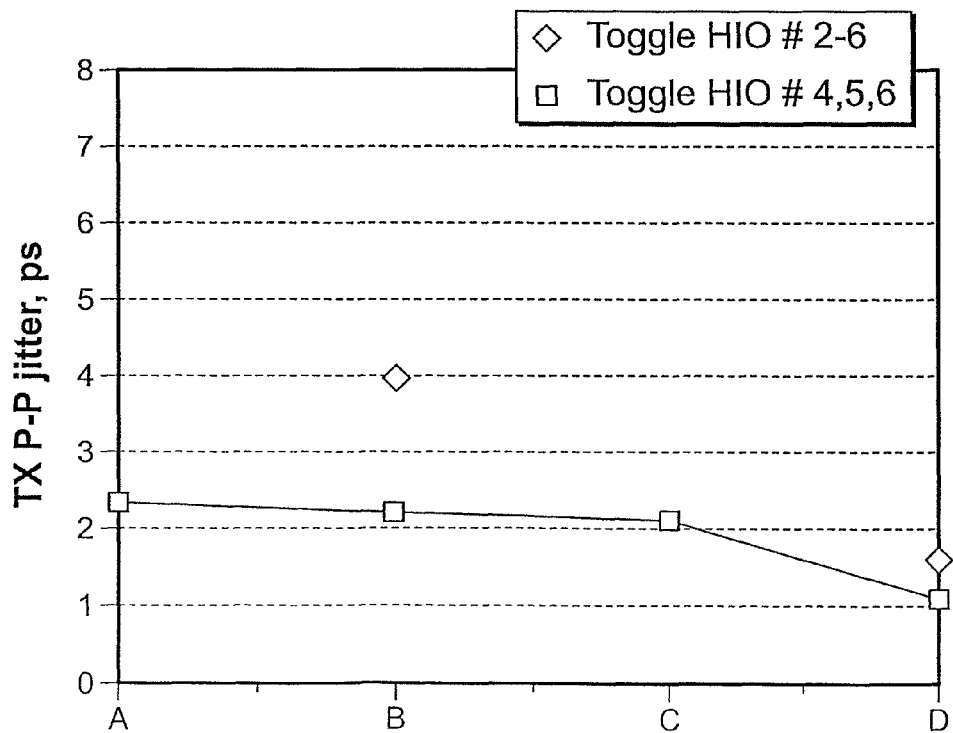
FIG. 4 is a plot comparing the jitter for different interfaces.

The embodiment of FIG. 3 has been found to provide adequate shielding for a high speed serial interface while saving many of the sites in the fifth column for use as GPIO contacts. FIG. 4 is a plot of signal jitter versus various interfaces. In circumstances where the contact in the fifth column adjacent the transmitter/receiver pair has no signal, the jitter is approximately 2.2 picoseconds (ps) as indicated along A. In the case where this contact is soft grounded, the jitter is approximately 2.2 ps as indicated along B. In the case where all the contacts in the fifth column are soft grounded, the jitter is approximately 2.1 ps as indicated along C. However, if the contact in the fifth column adjacent the transmitter/receiver pair is hard grounded as in the embodiment of FIG. 3, the jitter is approximately 1.1 ps as indicated along D.

Numerous variations may be practiced in the embodiment depicted in FIG. 3. For example, the basic configuration of transmitter/receiver pair contacts and ground contacts can be thought of as a pair of transmitter contacts or a pair of receiver contacts surrounded by six ground contacts in a hexagonal array. More particularly, first and second ground contacts are located in a row in the same two columns immediately above the first and second transmitter/receiver contact pair, third and fourth ground contacts are located in a row in the same two columns immediately below the first and second transmitter/receiver contact pair, a fifth ground contact in the same row as the transmitter/receiver pair in the column immediately to the left of the pair and a sixth ground contact in the same row as the transmitter/receiver pair in the column immediately to the right of the pair.

As will be apparent to those skilled in the art, numerous variations may be practiced within the spirit and scope of the present invention. For example, while the numbering of columns in the embodiments of the drawing is intended to specify physical structure, the numbering of columns in the claims is not intended to specify physical structure except where that is the clear intent.

What is claimed is:

1. A rectilinear array of packaging contacts formed on a substrate in rows and columns comprising:
   pairs of transmitter contacts and/or receiver contacts alternating row-by-row with pairs of ground contacts in a first four columns of contacts;
   a ground contact in a fifth column of contacts that is adjacent to each pair of transmitter or receiver contacts located in a row in the third and fourth columns; and
   general purpose input/output contacts located at remaining contact sites in the fifth column.

2. The rectilinear array of claim 1 further comprising a sixth column of contacts adjacent the fifth column wherein the contacts of the sixth column are general purpose input/output contacts.

3. The rectilinear array of claim 1 wherein the columns of contacts are parallel to an edge of the substrate.

4. The rectilinear array of claim 3 wherein the first column of contacts is adjacent to the edge of the substrate.

5. The rectilinear array of claim 3 wherein the first and second columns are adjacent to one another and comprise pairs of receiver contacts alternating row-by-row with pairs of ground contacts.

6. The rectilinear array of claim 5 wherein the third and fourth columns of contacts are adjacent to one another and comprise pairs of transmitter contacts alternating row-by-row with pairs of ground contacts.

7. The rectilinear array of claim 6 wherein the pairs of receiver contacts are in different rows from the pairs of transmitter contacts.

8. The rectilinear array of claim 3 wherein the third and fourth columns of contacts are adjacent to one another and comprise pairs of transmitter contacts alternating row-by-row with pairs of ground contacts.

9. The rectilinear array of claim 8 further comprising a ground contact in the second column of contacts that is adjacent to each pair of transmitter contacts located in a row in the third and fourth columns.

10. The rectilinear array of claim 1 further comprising a ground contact in the second column of contacts that is adjacent to each pair of transmitter or receiver contacts located in a row in the third and fourth columns.

11. The rectilinear array of claim 1 wherein the contacts are solder balls or solder bumps.

12. A rectilinear array of contacts formed in rows and columns on a substrate comprising:
   first and second transmitter contacts or first and second receiver contacts located in two adjacent columns in a row of the array;
   first and second ground contacts located in a row in the same two columns immediately above the first and second transmitter/receiver contacts,
   third and fourth ground contacts located in a row in the same two columns immediately below the first and second transmitter/receiver contacts,
   a fifth ground contact in the same row as the transmitter/receiver contacts in a column immediately to the left of the transmitter/receiver contacts;
   a sixth ground contact in the same row as the transmitter/receiver contacts in the column immediately to the right of the transmitter/receiver contacts; and
   a first general purpose input/output contact located in the same column as and immediately above the sixth ground contact and a second general purpose input/output contact located in the same column as and immediately below the sixth ground contact.

13. The rectilinear array of claim 12 further comprising general purpose input/output contacts located in a column immediately to the right of the sixth ground contact in the same row as the sixth ground contact and the rows immediately above and immediately below the sixth ground contact.

14. The rectilinear array of claim 12 wherein the columns are parallel to an edge of the substrate.

15. The rectilinear array of claim 12 wherein the contacts are solder balls or solder bumps.

16. A rectilinear array of contacts formed in rows and columns on a substrate comprising:
   first and second transmitter contacts located in two adjacent columns in a row of the array;
   first and second ground contacts located in a row in the same two columns immediately above the first and second transmitter contacts,
   third and fourth ground contacts located in a row in the same two columns immediately below the first and second transmitter contacts,
   a fifth ground contact in the same row as the transmitter/receiver contacts in a column immediately to the left of the transmitter contacts;
   a sixth ground contact in the same row as the transmitter contacts in the column immediately to the right of the transmitter contacts; and
   a first general purpose input/output contact located in the same column as and immediately above the sixth ground contact and a second general purpose input/output contact located in the same column as and immediately below the sixth ground contact.

17. The rectilinear array of claim 16 further comprising general purpose input/output contacts located in a column immediately to the right of the sixth ground contact in the same row as the sixth ground contact and the rows immediately above and immediately below the sixth ground contact.

18. The rectilinear array of claim 16 wherein the columns are parallel to an edge of the substrate.

\* \* \* \* \*